United States Patent
Kim et al.

(10) Patent No.: US 8,462,097 B2
(45) Date of Patent: Jun. 11, 2013

(54) GATE DRIVE CIRCUIT HAVING SHIFT REGISTER IN WHICH PLURAL STAGES ARE CONNECTED TO EACH OTHER

(75) Inventors: Kyung-Wook Kim, Seoul (KR); Jong-Hoon Kim, Cheonan-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 309 days.

(21) Appl. No.: 12/603,764

(22) Filed: Oct. 22, 2009

(65) Prior Publication Data

US 2010/0164854 A1    Jul. 1, 2010

(30) Foreign Application Priority Data

Dec. 26, 2008 (KR) .................. 10-2008-0134276

(51) Int. Cl.
    *G09G 3/36* (2006.01)
(52) U.S. Cl.
    USPC .................................................. 345/100
(58) Field of Classification Search
    USPC ..... 345/55, 98–100; 326/62, 63, 80; 327/333; 257/59
    See application file for complete search history.

(56) References Cited

U.S. PATENT DOCUMENTS

| | | | |
|---|---|---|---|
| 2005/0140909 A1* | 6/2005 | Kim et al. | 349/151 |
| 2008/0079685 A1* | 4/2008 | Umezaki et al. | 345/100 |
| 2008/0135846 A1* | 6/2008 | Shin et al. | 257/59 |
| 2008/0136756 A1* | 6/2008 | Yeo et al. | 345/87 |

FOREIGN PATENT DOCUMENTS

| | | |
|---|---|---|
| JP | 2002-055644 | 2/2002 |
| KR | 1020070121071 | 12/2007 |
| KR | 1020080053977 | 6/2008 |

OTHER PUBLICATIONS

English Abstract for Publication No. 2002-055644.
English Abstract for Publication No. 1020070121071.
English Abstract for Publication No. 1020080053977.

* cited by examiner

*Primary Examiner* — Chanh Nguyen
*Assistant Examiner* — Ram Mistry
(74) *Attorney, Agent, or Firm* — F. Chau & Associates, LLC

(57) ABSTRACT

A gate drive circuit includes a shift register having stages connected to each other in series. An (m)-th stage ('m' is a natural number) includes an output part, a discharging part, a first holding part and a second holding part. The output part outputs the first clock signal as a gate signal in response to a first clock signal provided from an external device and discharges the gate signal in response to a second input signal. The output part includes a first transistor having a first channel length. The discharging part discharges a signal of the first node to the second voltage level. The first holding part maintains a signal of the first node at a level of the gate signal, and is discharged to the second voltage level. The first holding part includes a second transistor having a second channel length that is longer than the first channel length. The second holding part maintains a signal of the first node at a level of the second voltage level.

14 Claims, 13 Drawing Sheets

USGATE DRIVE CIRCUIT HAVING SHIFT REGISTER IN WHICH PLURAL STAGES ARE CONNECTED TO EACH OTHER

CROSS-REFERENCE TO RELATED APPLICATION

This application claims priority under 35 U.S.C. §119 to Korean Patent Application No. 2008-134276, filed on Dec. 26, 2008 in the Korean Intellectual Property Office (KIPO), the contents of which are herein incorporated by reference in their entirety.

BACKGROUND OF THE INVENTION

1. Field of the Invention

Exemplary embodiments of the present invention relate to a gate drive circuit, a display device having the gate drive circuit and a method of manufacturing the gate drive circuit. More particularly, exemplary embodiments of the present invention relate to a gate drive circuit for enhancing reliability thereof, a display device having the gate drive circuit and a method of manufacturing the gate drive circuit.

2. Description of Related Art

Generally, a liquid crystal display (LCD) device includes an array substrate, an opposing substrate and a liquid crystal layer interposed between the array substrate and the opposing substrate. The LCD device displays an image by controlling light transmittance when a voltage is applied to the liquid crystal layer interposed between the array substrate and the opposing substrate.

The LCD device includes a display panel in which a plurality of pixel parts connected to gate lines and data lines crossing the gate lines is formed, a gate driving part outputting a gate signal to the gate line and a data driving section outputting a data signal to the data line. The gate driving part and the data driving section may be formed in a chip type, and may be formed on the display panel.

In order to decrease a size of a gate driving part and enhance efficiency of the gate driving part, the gate driving part is integrated on the display substrate in an integrated circuit. In the gate drive circuit integrated on the display substrate, as a parasitic capacitance of a pull-up element of the gate drive circuit is increased, a ripple is generated during an interval period of a gate off signal. A signal of a gate terminal of the pull-up element may be made unstable due to the ripple.

When a channel width W of a transistor for stabilizing a gate terminal of the pull-up element is increased to prevent the ripple from generating, a pull-up function of the pull-up element at a gate may be difficult during an interval period.

SUMMARY OF THE INVENTION

According to an exemplary embodiment of the present invention, a gate drive circuit includes a shift register in which plural stages are connected to each other in series and a gate structure is formed on a substrate. An (m)-th stage ('m' is a natural number) includes an output part, a discharging part, a first holding part and a second holding part. The output part outputs the first clock signal as a gate signal in response to a first clock signal provided from an external device and discharges the gate signal in response to a second input signal. The output part includes a first transistor having a first channel length. The discharging part discharges a signal of the first node to the second voltage level in response to the second input signal. The first holding part maintains a signal of the first node at a level of the gate signal, wherein the first holding part is discharged to the second voltage level in response to the first clock signal. The first holding part includes a second transistor having a second channel length that is longer than the first channel length. The second holding part maintains a signal of the first node at a level of the second voltage level in response to a second clock signal.

In an exemplary embodiment of the present invention, the second channel length is about 1.5 times to about 10 times longer than the first channel length. The second transistor may have a channel width that is wider than the second channel length by a multiple substantially equal to the multiple of the second channel length as compared to the first channel length. A summation of the channel width of the second transistor may be no more than about ten times of the second channel length of the transistor.

In an exemplary embodiment of the present invention, the second transistor may include a source electrode having a plurality of source electrode bars, and a drain electrode having a plurality of drain electrode bars that are spaced apart from each of the source electrode bars to be disposed between the source electrode bars. The second transistor may include a floating electrode disposed between each of the source electrode bars and each of the drain electrode bars, respectively.

In an exemplary embodiment of the present invention, the second transistor may include a gate electrode receiving the first clock signal, a source electrode connected to the first node, and a drain electrode connected to an output terminal in which the gate signal is outputted.

In an exemplary embodiment of the present invention, the first input signal may be a vertical start signal or a gate signal of one of previous stages in the series, and the second input signal may be a gate signal of the one of next stages in the series, or a vertical start signal.

In an exemplary embodiment of the present invention, the first clock signal may have a phase different from that of the second clock signal, the first voltage level may be a high voltage level, and the second voltage may be an off voltage level.

In an exemplary embodiment of the present invention, the output part may include a pull-up part and a pull-down part. The pull-up part receives the first clock signal from the external device and outputting the first clock signal as the gate signal in response to a signal of a first node, wherein the signal of the first node is converted into a first voltage level by a first input signal. The pull-down part discharges the gate signal to a second voltage level in response to the second input signal.

In an exemplary embodiment of the present invention, the gate drive circuit may further include a buffering part including a third transistor connected to the first node, the buffering part charging the first voltage level of the first input signal to the first node. Moreover, the gate drive circuit may further include a carry part outputting the first clock signal as a carry signal in response to a signal of the first node. The first input signal may be a vertical start signal or a carry signal of one of previous stages in the series, and the second input signal may be a gate signal of one of next stages in the series, or a vertical start signal.

In an exemplary embodiment of the present invention, the gate drive circuit may further include a third holding part, a fourth holding part and a switching part. The third holding part may maintain the gate signal at the second voltage level in response to the second clock signal. The fourth holding part may maintain the gate signal at the second voltage level alternately to the third holding part. The switching part may switch the fourth holding part on/off. Moreover, the gate drive circuit may further include a reset part providing the second voltage level to the first node in response to a reset signal.

According to an exemplary embodiment of the present invention, a display device includes a display panel, a data driving section and a gate drive circuit. The display panel includes a display area on which a plurality of pixel parts is formed and a peripheral area surrounding the display area. Each of the pixel parts is electrically connected to a gate line and a data line crossing the gate line. The data driving section outputs a data signal to the data lines. The gate drive circuit includes a shift register in which plural stages are connected to each other in series. An (m)-th stage ('m' is a natural number) includes an output part, a discharging part, a first holding part, and a second holding part. The output part outputs the first clock signal as a gate signal in response to a first clock signal provided from an external device and discharges the gate signal in response to a second input signal. The output part includes a first transistor having a first channel length. The discharging part discharges a signal of the first node to the second voltage level in response to the second input signal. The first holding part maintains a signal of the first node at a level of the gate signal, wherein the first holding part is discharged to the second voltage level in response to the first clock signal. The first holding part includes a second transistor having a second channel length that is longer than the first channel length. The second holding part maintains a signal of the first node at a level of the second voltage level in response to a second clock signal.

According to an exemplary embodiment of the present invention, a gate drive circuit comprises a shift register in which plural stages are connected to each other. Each of the stages includes a first transistor having a first channel length and outputting a clock signal as a gate signal, and a second transistor maintaining the gate signal at an off voltage in response to the first clock signal, the second transistor having a second channel length that is longer than the first channel length. A method of manufacturing the gate drive circuit includes patterning a gate metal layer on a base substrate to form a first gate electrode of the first transistor and a second gate electrode of the second transistor. A first active pattern having a first channel length is formed on the first gate electrode and a second active pattern having a second channel length on the second gate electrode. First source/drain electrodes are formed on the first active pattern, and a second source electrode and a second drain electrode are formed on the second active pattern. The second source electrode has a plurality of source electrode bars, and the second drain electrode has a plurality of drain electrode bars disposed between the source electrode bars.

In an exemplary embodiment of the present invention, forming the second drain electrode may include forming a floating electrode on the second active pattern between the source electrode bar and the drain electrode bar that are adjacent to each other.

In an exemplary embodiment of the present invention, the second channel length may have a channel length that is expanded N times ('N' is a natural number) longer than that of the first channel length.

In an exemplary embodiment of the present invention, the second active pattern may be manufactured by using a mask pattern in which a mask pattern corresponding to the first active pattern repeats a blocking pattern corresponding to each of the floating electrodes with a boundary for N times, when the first and second active patterns are formed.

In an exemplary embodiment of the present invention, the mask pattern may be a halftone mask.

According to an exemplary embodiment of the present invention, a gate drive circuit decreases a ripple of an off voltage of a first node during a pull-down interval period of a gate signal and does not interfere with maintaining of a high level voltage of the first node during a pull-up interval period of a gate signal, so that a driving reliability of the gate drive circuit may be enhanced.

BRIEF DESCRIPTION OF THE DRAWINGS

The present invention will become more apparent by describing in detailed exemplary embodiments thereof with reference to the accompanying drawings, in which.

DETAILED DESCRIPTION OF EXEMPLARY EMBODIMENTS

Figure 1:
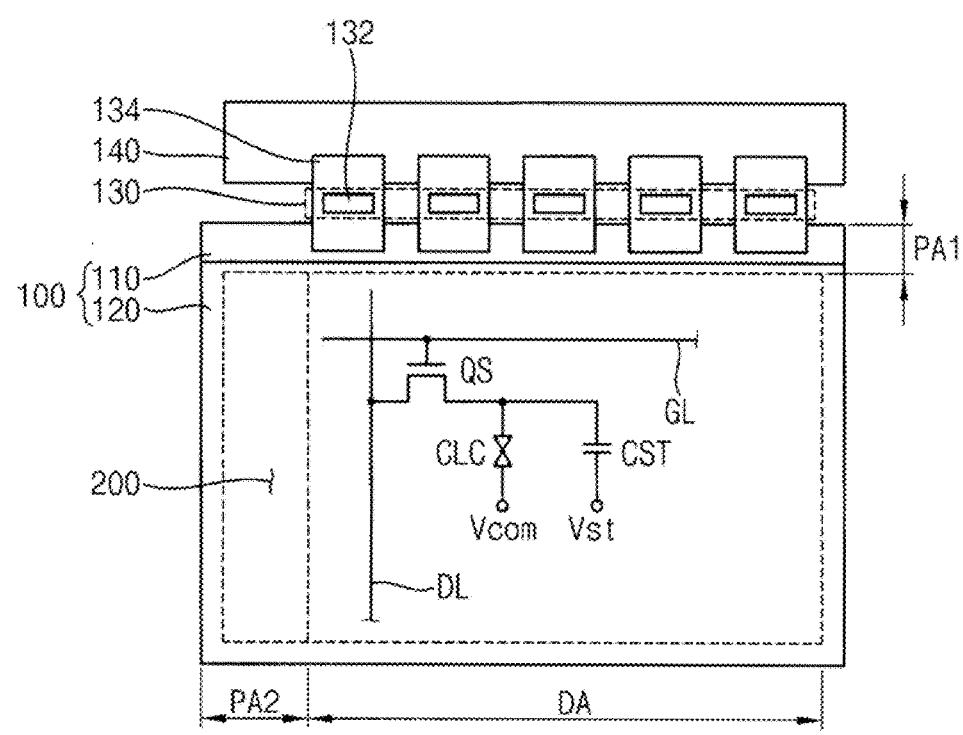
FIG. 1 is a plan view schematically illustrating a display device according to an exemplary embodiment of the present invention.

The present invention is described more fully hereinafter with reference to the accompanying drawings, in which exemplary embodiments of the present invention are shown. The present invention may, however, be embodied in many different forms and should not be construed as limited to exemplary embodiments set forth herein. Rather, exemplary embodiments are provided so that this disclosure will be thorough and complete, and will fully convey the scope of the present invention to those skilled in the art. In the drawings, the sizes and relative sizes of layers and regions may be exaggerated for clarity.

The terminology used herein is for the purpose of describing particular exemplary embodiments only and is not intended to be limiting of the present invention.

Hereinafter, the present invention will be explained in detail with reference to the accompanying drawings.

Figure 2:
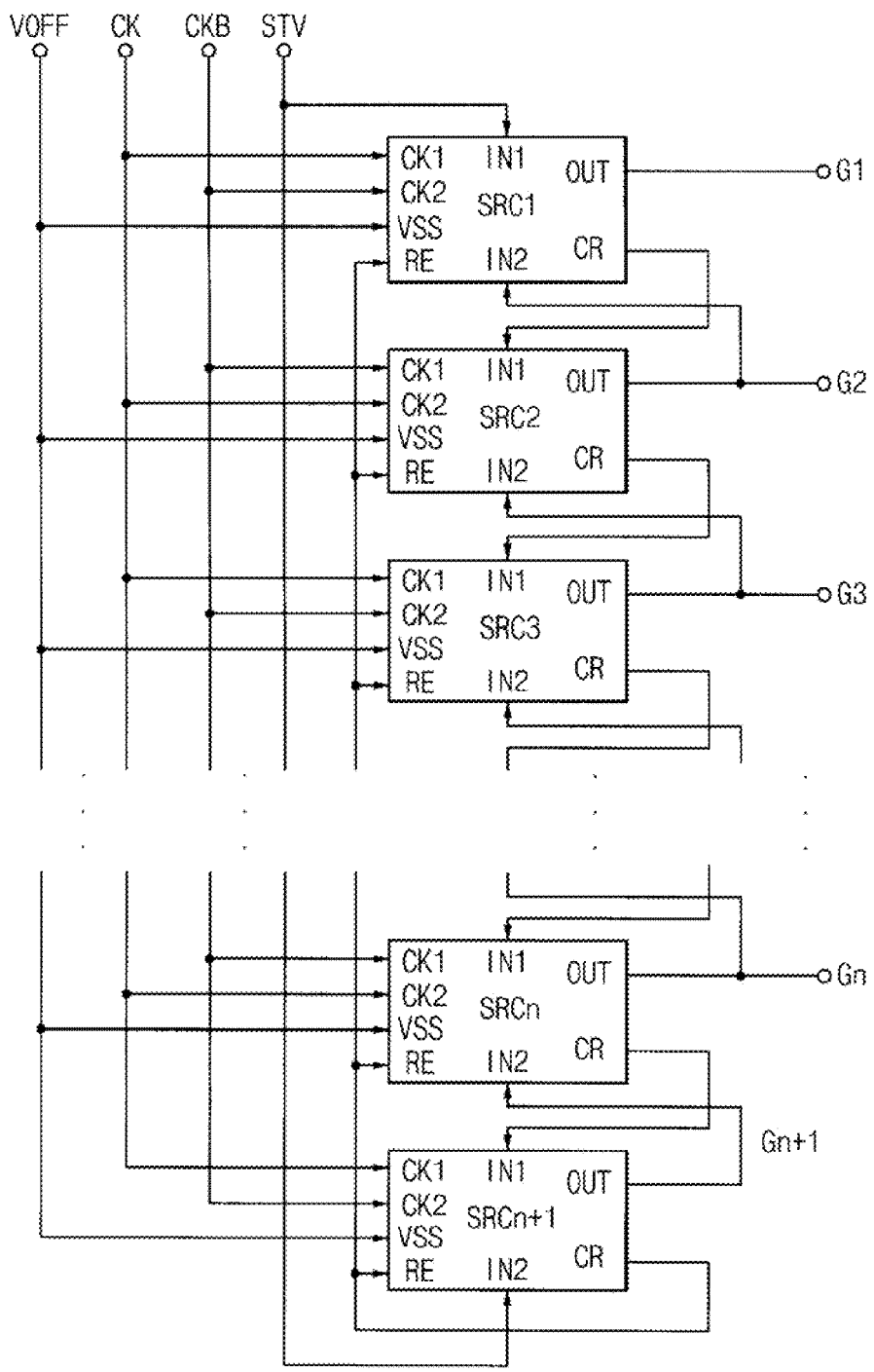
FIG. 2 is a block diagram illustrating a gate drive circuit of FIG. 1.

FIG. 1 is a plan view schematically illustrating a display device according to an exemplary embodiment of the present invention. FIG. 2 is a block diagram illustrating a gate drive circuit of FIG. 1.

Referring to FIGS. 1 and 2, the display device includes a display panel 100, a gate drive circuit 200 and a data driving section 130. The gate drive circuit 200 and the data driving section 130 drive the display panel 100.

The display panel 100 includes an array substrate, an opposing substrate (i.e., a color filter substrate) and a liquid crystal layer interposed between the array substrate and the opposing substrate. The display panel 100 includes a display area DA and a peripheral area PA surrounding the display area DA. A plurality of pixel parts is formed in the display area DA to display an image. The pixel parts are connected to a gate line GL extended in a first direction and a data line DL extended in a second direction crossing the first direction.

A thin-film transistor (TFT) QS is a switching element, a liquid crystal capacitor CLC electrically connected to the TFT QS and a storage capacitor CST electrically connected to the TFT QS are formed on each of pixel parts. For example, a gate electrode and a source electrode of the TFT QS are electrically connected to the gate line GL and the data line, respectively, and a drain electrode of the TFT QS is electrically connected to the liquid crystal capacitor CLC and the storage capacitor CST.

Here, the peripheral area PA includes a first peripheral area PA positioned at first end portions of the data line DL and a second peripheral area PA2 positioned at first end portions of the gate lines GL.

The data driving section 130 outputs a data signal to the data lines DL synchronized with the gate signal applied to the gate line GL. The data driving section 130 may include at least one data driving chip 132. The data driving chip 132 is mounted on a flexible printed circuit board 134 in which a first end portion thereof is connected to the first peripheral area PA1 of the display panel 100, a second end portion thereof is connected to a printed circuit board 140, so that the data driving chip 132 may be electrically connected to the printed circuit board 134 and the display panel 100 through the flexible printed circuit board 134.

The gate drive circuit 200 includes a shift register in which a plurality of stages is connected to each other in series. The gate drive circuit 200 sequentially outputs a gate signal to the gate lines GL. The gate drive circuit 200 may be integrated on the second peripheral area PA2 of the display panel 100 in an integrated circuit (IC). When the gate drive circuit 200 is integrated on the display panel 100, a gate metal film for the gate drive circuit 200 may have a three-layered structure to realize a low resistance line. For example, the gate metal film includes sequential Mo—Al—Mo layers, wherein a first molybdenum (Mo) layer is formed, an aluminum (Al) layer is sequentially formed on the first molybdenum (Mo) layer and a second molybdenum (Mo) layer is sequentially formed on the aluminum (Al) layer. Alternatively, the gate metal film may include, for example, a metallic material such as aluminum (Al), molybdenum (Mo), chromium (Cr), tantalum (Ta), titanium (Ti), tungsten (W), copper (Cu), silver (Ag), etc., or a metal alloy thereof.

Referring to FIG. 2, the shift register includes first to (n+1)-th stages SCR1 to SRCn+1 that are connected to each other in series, where 'n' is an odd number.

In the first to (n+1)-th stages SRC1 to SRCn+1, the first to n-th stages SRC1 to SRCn output n numbers of gate signals, and the (n+1)-th stage SRCn+1 outputs a reset signal to the first to n-th stages SRC1 to SRCn. During an interval period, the shift register may include an (n+2)-th stage SRCn+2 or more stages in order to reduce noise components, which will be included in an output of the n-th stage SRCn.

Each of the first to (n+1)-th stages SRC1 to SRCn+1 includes a first clock terminal CK1, a second clock terminal CK2, a first input terminal IN1, a second input terminal IN2, a voltage terminal VSS, a reset terminal RE, a carry terminal CR and an output terminal OUT.

The first clock terminal CK1 receives a first clock signal CK, and the second clock terminal CK2 receives a second clock signal CKB having a phase different from that of the first clock signal CK. For example, the first clock signal CK is provided to the first clock terminals CK1 of odd-numbered stages SRC1, SRC3, . . . , SRCn+1, and the second clock signal CKB is provided to the second clock terminals CK2 of the odd-numbered stages SRC1, SRC3, . . . , SRCn+1. The second clock signal CKB is provided to the first clock terminals CK1 of even-numbered stages SRC2, SRC4, . . . , SRCn, and the first clock signal CK is provided to the second clock terminals CK2 of the even-numbered stages SRC2, SRC4, . . . , SRCn. When a third clock signal having a phase different from the first and second clock signals CK and CKB is employed to the shift register, the third clock signal may be provided to each of the stages.

A vertical start signal STV or a carry signal of one of previous stages is provided to the first input terminal IN1. The vertical start signal STV is provided to the first input terminal IN1 of the first stage SRC1, and the carry signal of one of previous stages SRC2 to SRCn is provided to the first input terminals IN1 of the respective second to (n+1)-th stages SRC2 to SRCn+1.

A gate signal of one of next stages or the vertical start signal STV is provided to the second input terminal IN2. That is, the gate signals outputted from the following stages SRC2 to SRCn+1 are provided to the second input terminals IN2 of the respective first to n-th stages SRC1 to SRCn, and the vertical start signal STV is provided to the second input terminal IN2 of the (n+1)-th stage SRCn+1.

An off voltage VOFF is provided to the voltage terminal VSS, and a carry signal of the (n+1)-th stage SRCn+1 is provided as a reset signal to the reset terminal RE.

The output terminal OUT outputs a gate signal to a gate line electrically connected thereto. Odd-numbered gate signals outputted from the output terminal OUT of the odd-numbered stages SRC1, SRC3, . . . , SRCn+1 are outputted at a high interval period of the first clock signal CK. Even-numbered gate signals outputted from the output terminal OUT of the even-numbered stages SRC2, SRC4, . . . , SRCn are outputted at a high interval period of the second clock signal CKB. Therefore, the first to (n+1)-th stages SRC1 to SRCn+1 sequentially output gate signals G1, G2, . . . , Gn.

Figure 3:
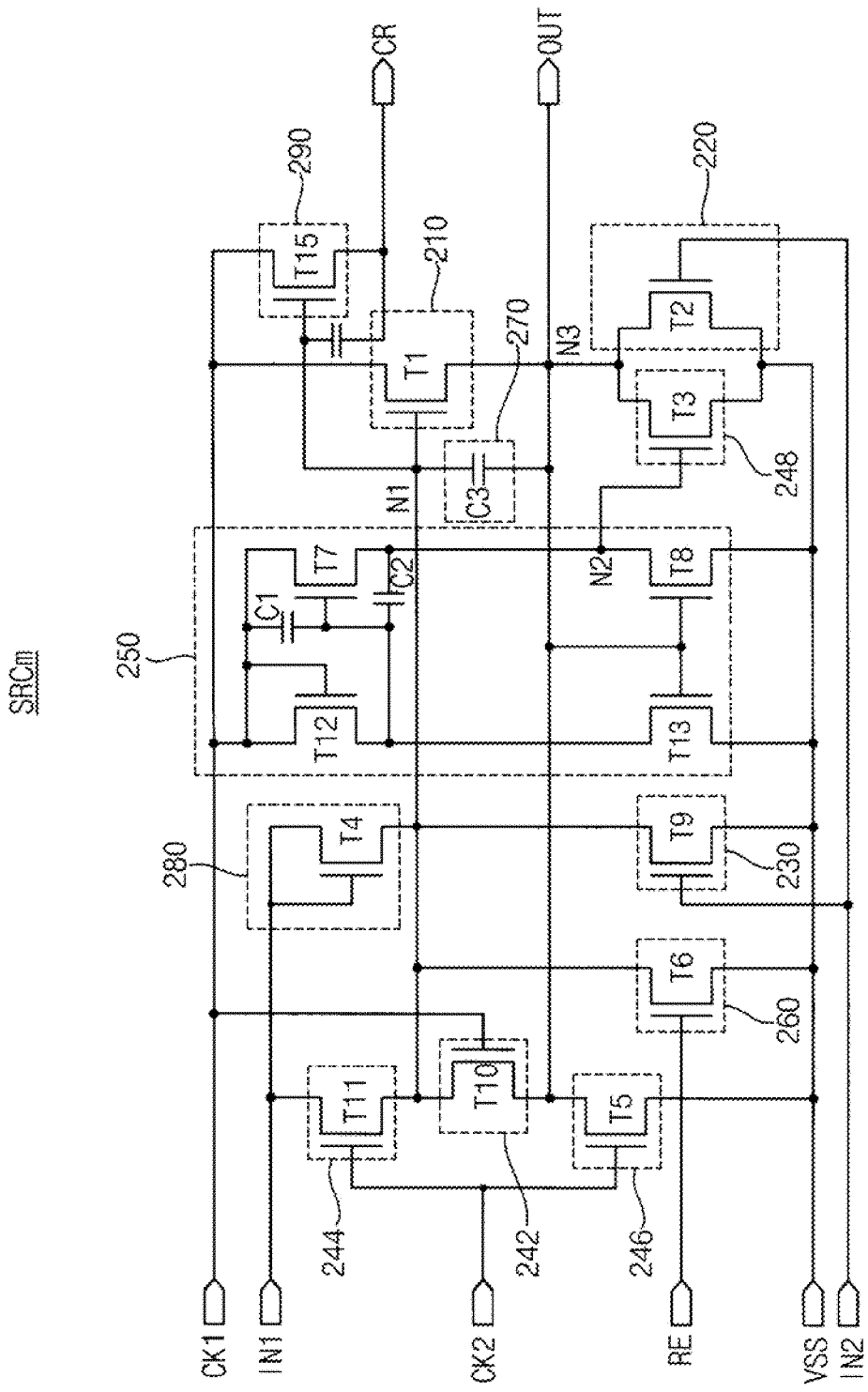
FIG. 3 is a circuit diagram illustrating a stage of FIG. 2.
Figure 4:
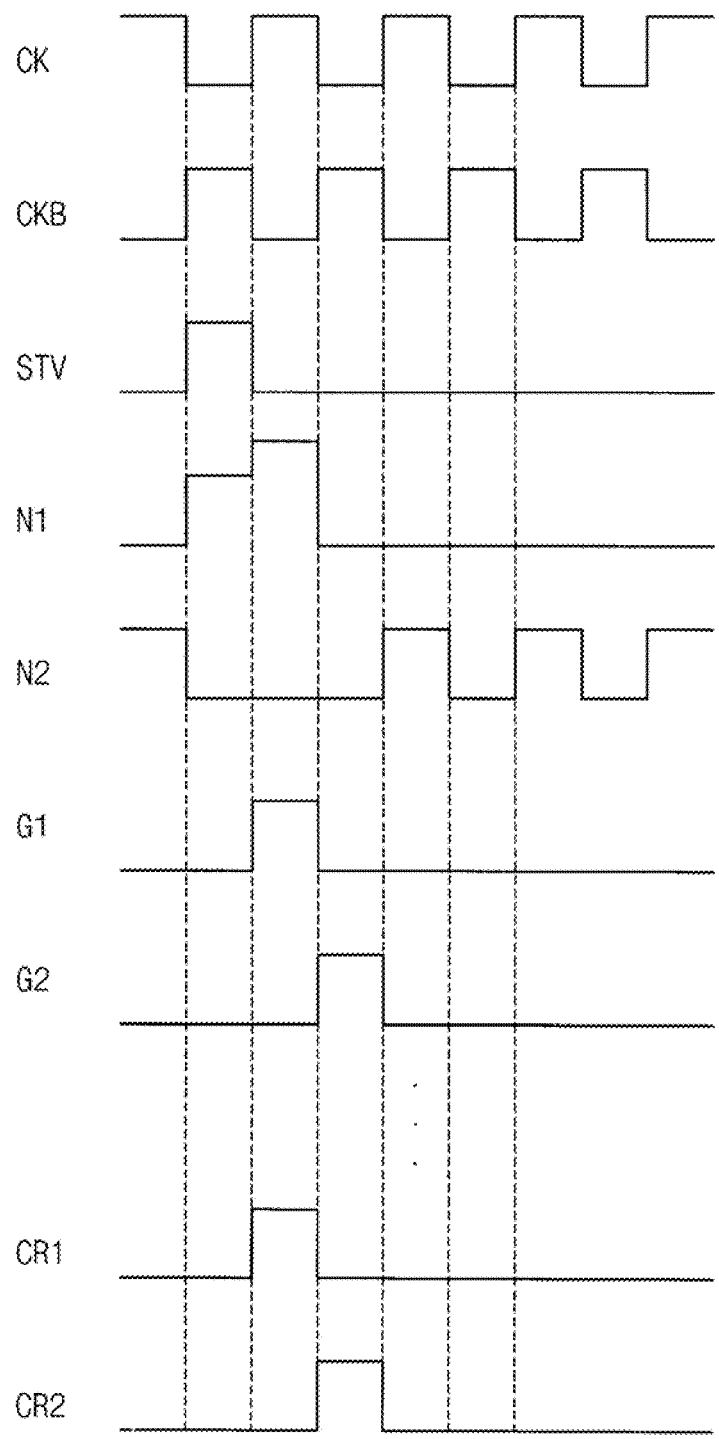
FIG. 4 is waveform diagrams showing signals of a stage of FIG. 3.

FIG. 3 is a circuit diagram illustrates a stage of FIG. 2. FIG. 4 is a waveform diagram showing signals of a stage of FIG. 3.

Referring to FIGS. 3 and 4, (m)-th stage SRCm includes a pull-up part 210, a pull-down part 220, a discharging part 230, a first holding part 242 and a second holding part 244.

The pull-up part 210 pulls-up m-th gate signal Gm to the first clock signal CK in response to a carry signal of the (m−1)-th stage SRCm−1, and the pull-down part 220 pulls down the m-th gate signal Gm to the off voltage VOFF in response to a gate signal Gm+1 of the (m+1)-th stage SRCm+1.

The pull-up part 210 includes a first transistor T1 having a gate electrode connected to the first node NI, a drain electrode connected to the first clock terminal CK1 and a source electrode connected to the output terminal OUT. Thus, the drain electrode of the first transistor T1 receives the first clock signal CK through the first clock terminal CK1.

The pull-down part 220 includes a second transistor T2 having a gate electrode connected to the second input terminal IN2, a drain electrode connected to the output terminal OUT and a source electrode connected to a voltage terminal VSS to receive the off voltage VOFF.

The m-th stage SRCm includes a pull-up driving part, which turns-on the pull-up part 210 in response to a carry signal of the (m−1)-th stage SRCm−1 and turns-off the pull-up part 210 in response to a gate signal Gm+1 of an (m+1)-th stage SRCm+1. The pull-up driving part may further include a buffering part 280 and a charging part 270.

The discharging part 230 includes a ninth transistor T9 having a gate electrode connected to the second input terminal IN2, a drain electrode connected to the first node N1 and a source electrode connected to the voltage terminal VSS to receive the off voltage VOFF.

The buffering part 280 includes a fourth transistor T4 having a gate electrode and a drain electrode each connected to the first input terminal IN1, and a source electrode connected to the first node N1.

The charging part 270 includes a third capacitor C3 having a first electrode connected to the first node N1 and a second electrode connected to the output terminal OUT.

In the pull-up driving part, when the fourth transistor T4 is turned-on in response to the carry signal of the (m−1)-th stage SRCm−1, the carry signal is applied to the first node N1 so that the first node N1 is converted into a high level and the third capacitor C3 is simultaneously charged. When charges that are higher than a threshold voltage of the first transistor T1 are charged in the third capacitor C3 and the first clock signal CK is converted into a high interval period, the first transistor T1 is bootstrapped so that a first clock signal CK of the high level is outputted to the output terminal OUT. The first transistor T1 is bootstrapped, so that m-th gate signal Gm that is an output signal of the m-th stage SRCm is outputted.

When the ninth transistor T9 is turned on in response to the (m+1)-th gate signal Gm+1, charges in the third capacitor C3 are discharged to an off voltage VOFF of the voltage terminal VSS so that the first transistor T1 is turned off.

The m-th stage SRCm includes a first holding part 242 and a second holding part 244, which maintain a signal of the first node N1, and the signal is applied to a control terminal of the pull-up part 210 to a level of the off voltage VOFF.

The first holding part 242 includes a tenth transistor T10 having a gate electrode connected to the first clock terminal CK1, a source electrode connected to the first node N1, and a drain electrode connected to the output terminal OUT. The second holding part 244 includes an eleventh transistor T11 having a gate electrode connected to the second clock terminal CK2, a drain electrode connected to the first input terminal IN1, and a source electrode connected to the first node N1.

The first and second holding parts 242 and 244 control a signal of the first node N1, so that the signal of the first node N1 maintains a level of the off voltage VOFF after the m-th gate signal Gm is shifted to a level of the off voltage VOFF by the pull down part 220.

That is, when the tenth transistor T10 is turned on in response to the first clock signal CK, the m-th gate signal Gm discharged to a level of the off voltage VOFF is applied to the first node N1 so that the first node N1 maintains a level of the off voltage VOFF.

The tenth transistor T10 has a ratio of channel width to channel length (W/L) that is relatively greater than that of other transistors of a gate drive circuit. As the channel width 'W' is increased, a ripple component of the first node N1 connected to the source electrode is substantially restrained when the first clock signal CK inputted to the gate electrode of the tenth transistor T10 is falling. A detailed description of the above will be explained with reference to FIG. 5.

Moreover, when the eleventh transistor T11 is turned off in response to the second clock signal CKB, a first input signal of an off voltage VOFF is applied to the first node N1 so that the first node N1 is maintained at a level of the off voltage VOFF.

As described above, each of the first and second holding parts 242 and 244 is alternately turned on in response to the first and second clock signals CK and CKB, respectively, to maintain a signal of the first node N1 to a level of the off voltage VOFF.

The m-th stage SRCm may further include a third holding part 246, a fourth holding part 248 and a switching part 250. After the gate signal is outputted and the third node N3 is converted into a level of an off voltage VOFF by the pull-down part 220, the third and fourth holding parts 246 and 248 control the third node N3 to stably maintain a level of off voltage VOFF before a gate signal of a following frame is outputted to substantially isolate an external noise such as a variation of the first and second clock signals CK and CKB. The switching part 250 controls an on/off operation of the fourth holding part 248.

The third holding part 246 includes a fifth transistor T5 having a gate electrode connected to the second clock terminal CK2, a drain electrode connected to the output terminal OUT, and a source electrode connected to the voltage terminal VSS to receive the off voltage VOFF. The fourth holding part 248 includes a third transistor T3 having a gate electrode connected to the second node N2, a drain electrode connected to the output terminal OUT, and a source electrode connected to the voltage terminal VSS to receive the off voltage VOFF.

The switching part 250 includes a twelfth transistor T12, a thirteenth transistor T13, a seventh transistor T7, an eighth transistor T8, a first capacitor C1 and a second capacitor C2.

The twelfth transistor T12 includes a gate electrode and a drain electrode that are each connected to the first clock terminal CK1 to receive the first clock signal CK, and a source electrode connected to a drain electrode of the thirteenth transistor T13, so that the twelfth transistor T12 receives the off voltage VOFF. The seventh transistor T7 includes a drain electrode connected to the first clock terminal CK1, a gate electrode connected to the first clock terminal CK1 through the first capacitor C1, and a source electrode connected to the second node N2.

Thus, a drain electrode and a gate electrode of the seventh transistor T7 receive the first clock signal CK. The second capacitor C2 is connected to the gate electrode and a source electrode of the seventh transistor T7. The eighth transistor T8 includes a gate electrode connected to the output terminal OUT, a drain electrode connected to the second node N2, and a source electrode connected to the voltage terminal VSS, so that the eighth transistor T8 receives the off voltage VOFF.

When the m-th stage SRCm outputs the first clock signal CK as a gate signal Gm of a high level, as the output terminal OUT is converted into a high level, the thirteenth and eighth transistors T13 and T8 are turned off. Thus, the off voltage VOFF is applied to the second node N2. Here, as the first clock signal CK is a high state, the twelfth and seventh transistors T12 and T7 also turned on so that the first clock signal CK of a high level is applied to the second node N2. Thus, a division voltage between a voltage level of the first clock signal CK and a voltage level of the off voltage VOFF is applied to a gate electrode of the third transistor T3 in proportion to a resistor ratio between the seventh transistor T7 and the eighth transistor T8. Here, when the division voltage is designed to be no higher than a threshold voltage of the third transistor T3, the third transistor T3 maintains a turn-off state so that the third node N3 may maintain a high level state.

When an (m+1)-th gate signal Gm+1 of a high level is inputted to the second input terminal IN2, the second transistor T2 is turned on so that the third node N3 is discharged to the off voltage VOFF. Here, the thirteenth and eighth transistors T13 and T8 are turned off. Simultaneously, as the second clock signal CK2 is a high state, the fifth transistor T5 is turned on so that the third node N3 may be more rapidly achieved a level of the off voltage VOFF.

During an interval period, except an interval period in which the m-th gate signal and the (m+1)-th gate signal are outputted for one frame interval period, the third node N3 may stably maintain the off voltage VOFF substantially without noise caused by the third and fourth holding parts 246 and 248 alternately responding to the second clock signal CKB and the first clock signal CK.

That is, as the m-th gate signal GOUTm is discharged to a level of an off voltage VOFF in response to the (m+1)-th gate signal GOUTm+1, the thirteenth and eighth transistors T13 and T8 are turned off. When the first clock signal CK is converted into a high level before the m-th gate signal GOUTm of a following frame is outputted, a voltage potential of the second node N2 is converted into a high level by a voltage outputted from the eleventh and seventh transistors T12 and T7. As the voltage potential of the second node N2 is converted into a high level, the third transistor T3 is turned on and a voltage potential of the output terminal OUT may be more rapidly discharged to a level of an off voltage VOFF.

When the first clock signal CK is converted into a low level, the second node N2 is converted into a low level so that the eleventh transistor T11 is turned off. The fifth transistor T5 is turned on by the second clock signal CKB having a phase opposite to the first clock signal CK, so that an output terminal OUT is discharged in an off voltage VOFF.

Each of the third and fourth holding parts 246 and 248 alternately discharges a voltage potential of the output terminal OUT into an off voltage VOFF in response to the second clock signal CKB and the first clock signal CK, respectively.

The m-th stage SRCm of the gate drive circuit 200 may further include a reset part 260 and a carry part 290.

The reset part 260 includes a sixth transistor T6 providing the first node N1 with the off voltage VOFF. The sixth transistor T6 includes a gate electrode connected to a reset terminal RE, a drain electrode connected to the first node N1, and a source electrode connected to the voltage terminal VSS.

The reset part 260 receives a carry signal of the (n+1)-th stage SRCn+1 that is the last stage, and resets the first node N1 of whole stages to the off voltage VOFF after one frame is ended. Since the third node N3 of the (n+1)-th stage SRCn+1 does not reset before the vertical start signal STV is inputted, the first node N1 may be stably maintained at the off voltage VOFF during a black interval period.

The carry part 290 includes a fifteenth transistor T15 having a gate electrode connected to the first node N1, a drain electrode connected to the first clock terminal CK1 to receive the first clock signal CK, and a source electrode connected to the carry terminal CR. As a voltage potential of the first node N1 is converted into a high level, the carry part 290 outputs the first clock signal of a high level through the carry terminal CR.

The carry signal outputted from the carry part 290 is provided to the first input terminal IN1 of the following stage to control an operation start thereof. Alternatively, the carry part 290 may be removed, and the gate signal outputted from the output terminal OUT may be provided to the first input terminal IN1 of the following stage. A load of the gate line, which corresponds to a high resolution panel or a large scaled panel such as a resolution higher than an extended graphics array (XGA) resolution, is greater than a load of a gate line corresponding to a low resolution panel or a small scaled panel, so that a low portion of the panel is not driven due to a signal delay when a gate signal is used as a carry signal. Thus, an additional carry part 290 may be formed.

Figure 5:
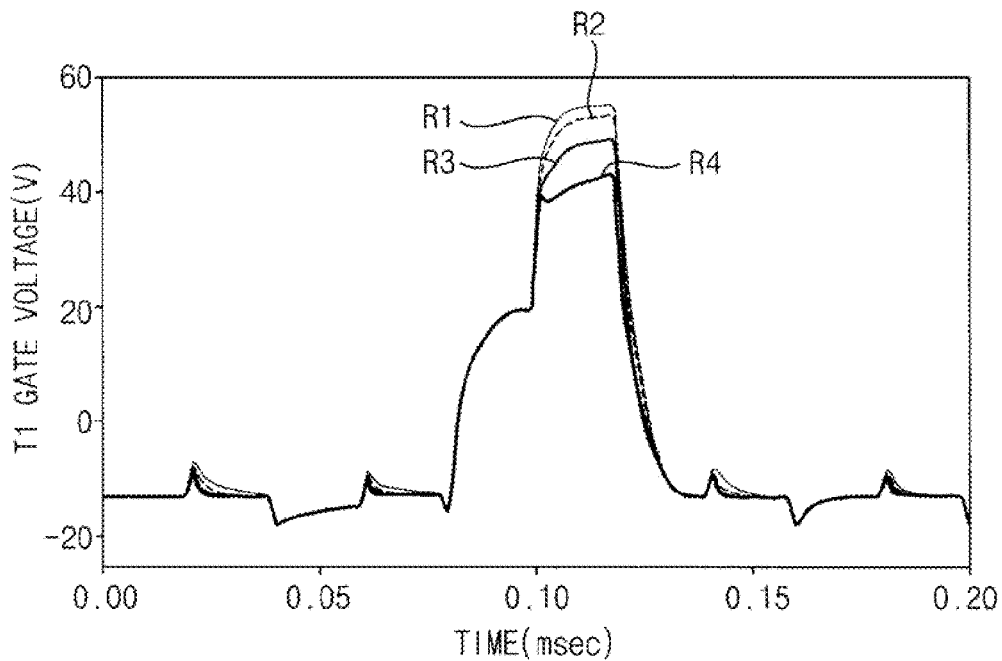
FIG. 5 is a waveform diagram illustrating a simulation of a ripple voltage of a first node in accordance with a variation of a channel width of a tenth transistor of FIG. 3.

FIG. 5 is a waveform diagram illustrating a simulation of a ripple voltage of a first node in accordance with a variation of a channel width of a tenth transistor T10 of FIG. 3.

FIG. 5 shows a ripple voltage of the first node N1 measured at a room temperature, when a channel width 'W' is varied at a condition which a channel length 'L' of the tenth transistor T10 of FIG. 3 is fixed.

The tenth transistor T10 maintain a voltage of the gate terminal of the first transistor T1 of FIG. 3, that is, a signal of the first node N1 is maintained at a level of the off voltage VOFF, after the m-th gate signal Gm is shifted to a level of the off voltage VOFF by the pull-down part 220.

Referring to FIG. 5, while a signal of the first node N1 is maintained at a level of the off voltage VOFF, a ripple voltage is generated at the first node N1. As the gate drive circuit may malfunction due to the ripple voltage, according to an exemplary embodiment of the present invention, the ripple voltage is substantially removed.

In a case of a channel length 'L' of the tenth transistor T10 was fixed, a voltage of the first node N1 was measured by varying the channel width 'W'. A first ripple voltage waveform R1 represents a ripple voltage measured at the first node N1 when the channel width 'W' of the tenth transistor T10 was about 100 μm. A second ripple voltage waveform R2 represents a ripple voltage measured at the first node N1 when the channel width 'W' of the tenth transistor T10 was about 250 μm. A third ripple voltage waveform R3 represents a ripple voltage measured at the first node N1 when the channel width 'W' of the tenth transistor T10 was about 500 μm. A fourth ripple voltage waveform R4 represents a ripple voltage measured at the first node N1 when the channel width 'W' of the tenth transistor T10 was about 750 μm.

Referring to first to fourth ripple voltage waveforms R1, R2, R3 and R4, as the channel width 'W' of the tenth transistor T10 is increased, a ripple voltage of the first node N1 is decreased while a signal of the first node N1 is maintained at a level of the off voltage VOFF.

However, as the channel width 'W' is increased, a voltage maintaining a high level of the first node N1 is decreased in a pull-up interval period of the first transistor T1. Thus, when the channel width 'W' of the tenth transistor T10 is excessively increased, a turn-on status of the first transistor T1 is unstable so that a driving margin of the first transistor T1 may be decreased.

According to an exemplary embodiment of the present invention, a design of the tenth transistor T10 restrains the ripple voltage during a pull-down interval period of the first transistor T1 and enhances a driving reliability of the gate drive circuit during a pull-up interval period.

Figure 6:
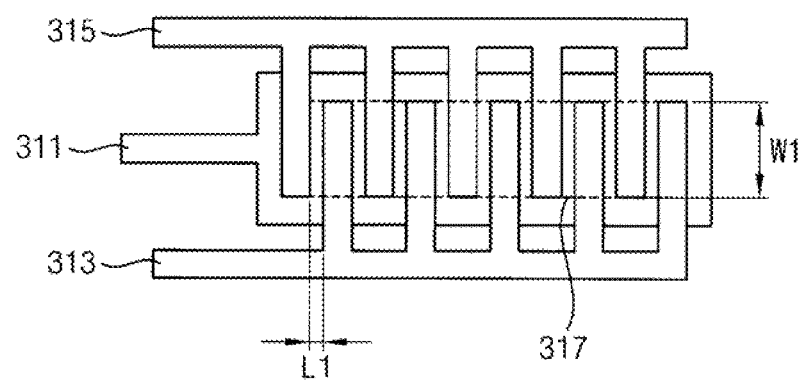
FIG. 6 is a plan view illustrating a first transistor of FIG. 3.

FIG. 6 is a plan view illustrating a first transistor T1 for comparing with the tenth transistor T10 of FIG. 3.

Figure 7:
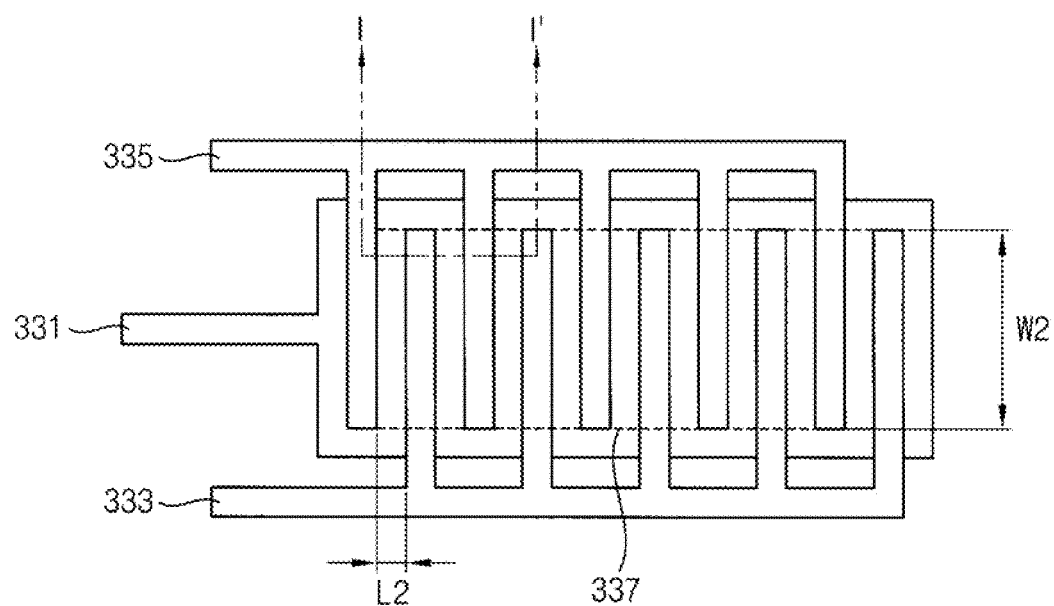
FIG. 7 is a plan view illustrating a tenth transistor of FIG. 3.

FIG. 7 is a plan view illustrating a tenth transistor T10 of FIG. 3.

Referring to FIGS. 6 and 7, the tenth transistor T10 according to an exemplary embodiment the present invention has a channel length L2 of about double a channel length L1 of the first transistor T1. The described channel length of the tenth transistor T10 is exemplary, and the channel length of the tenth transistor T10 may be varied in accordance with a design of the gate drive circuit.

Referring to FIG. 6, a first transistor of FIG. 3 includes a gate electrode 311, a source electrode 313 having a plurality of source electrode bars, a drain electrode 315 having a plurality of drain electrode bars, and a channel 317 defined by the source electrode 313 and the drain electrode 315 on the gate electrode 311. The channel 317 of the first transistor T1 is substantially the same as a channel width W1 of the first transistor T1. For example, the channel length L1 may be about 4 μm.

Referring to FIG. 7, the tenth transistor T10 according to an exemplary embodiment of the present embodiment includes a gate electrode 331, a source electrode 333 having a plurality of source bars, a drain electrode 335 having a plurality of drain electrode bars, and a channel 337 defined by the source electrode 333 and the drain electrode 335 on the gate electrode 331.

The channel 337 of the tenth transistor T10 according to an exemplary embodiment of the present invention has a channel length L2 of about 8 μm and a channel width W2. The tenth transistor T10 of the present invention has a channel length L2 that is increased by about double a channel length of the first transistor T1. Moreover, in the tenth transistor T10, the channel width W2 is increased in proportion with the channel length L2, so that a driving margin of the tenth transistor T10 may be secured.

When five masks are used in a manufacturing process of the gate drive circuit, in order to expand a channel length L2 of the tenth transistor T10, a slit width of a mask area corresponding to the tenth transistor T10 may be expanded by the increased channel length L in comparison with the remaining transistors except the tenth transistor T10.

FIGS. 8A to 8E are cross-sectional views illustrating a method of manufacturing tenth transistor T10 of FIG. 7. For convenience of description, cross-sectional views taken along a line I-I' in the tenth transistor T10 will be described in FIGS. 8A to 8E.

Figure 8A:
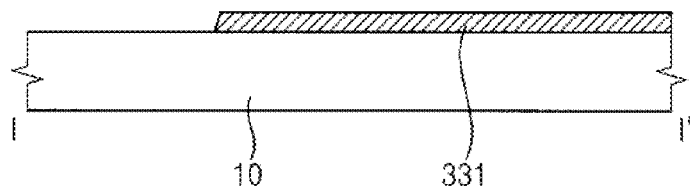
FIGS. 8A to 8E are cross-sectional views illustrating a method of manufacturing the tenth transistor of FIG. 7.

Referring to FIG. 8A, a gate metal layer is formed on a base substrate 10, and the gate metal layer is patterned to faun a gate electrode 331.

For example, the gate metal layer is formed through a metal deposition method such as a sputtering deposition method, etc. The gate metal layer may include at least one of chromium (Cr), chromium (Cr) alloy, molybdenum (Mo), molybdenum-nitride (MoN), molybdenum-niobium (MoNb), molybdenum (Mo) alloy, copper (Cu), copper (Cu) alloy, copper-molybdenum (CuMo) alloy, aluminum (Al), aluminum (Al) alloy, silver (Ag) and silver (Ag) alloy. The gate metal layer may include a single-layered structure or a double-layered structure. In one example, when the gate metal layer includes the single-layered structure, the gate metal layer is formed by aluminum (Al) or aluminum-neodinum (Al—Nd) alloy. In another example, when the gate metal layer includes the double-layered structure, a lower metal layer of the gate metal layer is formed by a metal material having relatively high mechanical and chemical characteristics such as chromium (Cr), molybdenum (Mo), molybdenum alloy, etc., and an upper metal layer the gate metal layer is formed by a metal material having a relatively low specific resistance such as aluminum (Al), aluminum alloy, etc. The lower metal layer corresponds to a main metal layer providing the gate drive signal. The upper metal layer may protect the lower metal layer from being damaged in a manufacturing process of a display substrate. Although the above-described exemplary embodiment discusses only a single-layered structure and a double-layered structure, a multi-layered structure such as a triple-layered structure, a four-layered structure or any other configuration known to those skilled in the art may also be utilized in place of or in conjunction with the single-layered structure or the double-layered structure. The gate metal layer is patterned through a photolithograph process and an etching process using a first mask to form a gate pattern including a gate electrode 331 and a gate line.

Referring to FIGS. 8B to 8E, a gate insulation layer 30 is formed on a substrate 331 on which the gate pattern is formed, and a data pattern is formed on the gate insulation layer 30. The data pattern includes an active layer 40 for forming a channel of a transistor, a source electrode 335 having a plurality of source electrode bars, and a drain electrode 333 having a plurality of drain electrode bars. Here, an ohmic contact layer 51 may be formed between the active layer 40 and a data pattern.

Figure 8B:
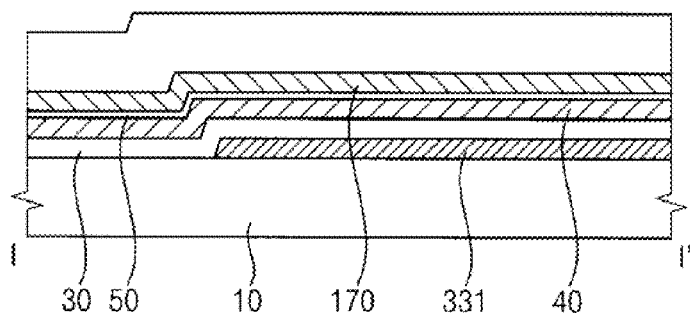

Referring to FIG. 8B, a gate insulation layer 30, an amorphous silicon layer 40, N+ amorphous silicon layer 50 that is formed by implanting N+ impurities, and a data metal layer 170 are sequentially formed on a substrate 10 on which a gate pattern is formed. The gate insulation layer 30, the amorphous silicon layer 40, and the N+ amorphous silicon layer 50 may be formed through a plasma enhanced chemical vapor deposition (PECVD) method, and the data metal layer 170 may be formed through a sputtering deposition method.

The gate insulation layer 30 includes an insulation material such as a silicon nitride layer (SiNx) and a silicon oxide layer (SiOx). The data metal layer 170 may include at least one of chromium (Cr), chromium (Cr) alloy, molybdenum (Mo), molybdenum nitride (MoN), molybdenum niobium (MoNb), molybdenum (Mo) alloy, copper (Cu), copper (Cu) alloy, copper molybdenum (CuMo) alloy, aluminum (Al), aluminum (Al) alloy, silver (Ag) and silver (Ag) alloy. The data metal layer 170 may include a single-layered structure or a double-layered structure. A photoresist 350 is deposited on the data metal layer 170 and the photoresist 550 is exposed and developed through a photolithography process using a mask 300, so that a photoresist pattern 360 is formed.

Figure 8C:
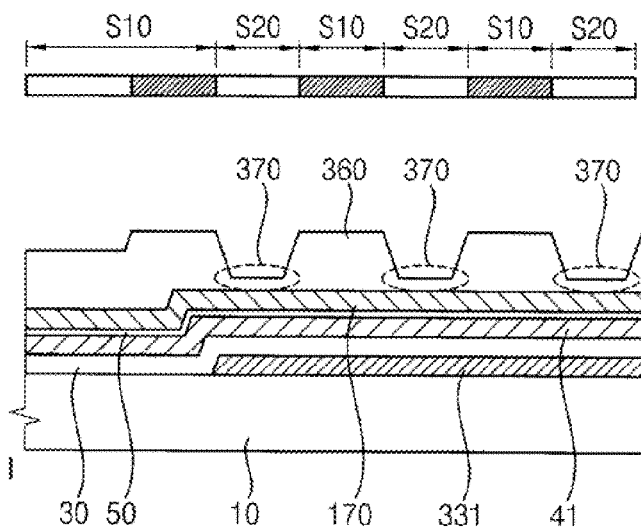

Referring to FIG. 8C, the mask 300 has a light-blocking area S10 and a slit area S20. Lights are blocked in the light-blocking area S10, so that a photoresist pattern 360 is remained after an exposing process. However, a portion of lights in the slit area S20 is transmitted, so that a photoresist pattern 350 is remained after the exposing process. A single slit may be formed in the slit area S20, and plural slits may be formed in the slit area S20.

In patterning the data metal layer using the mask 300, the light-blocking area S10 of the mask 300 is positioned at an area where a semiconductor layer 41, an ohmic contact layer 51 and a data pattern will be formed to block lights, so that a photoresist pattern 360 of FIG. 8C may be remained after a developing process.

The slit area S20 is positioned at an area where a channel of the tenth transistor T10 will be formed to diffract incident lights, so that a remaining photoresist pattern 370 having a thinner thickness than the photoresist pattern 360 may remain after a developing process as illustrated in FIG. 8C.

Figure 8D:
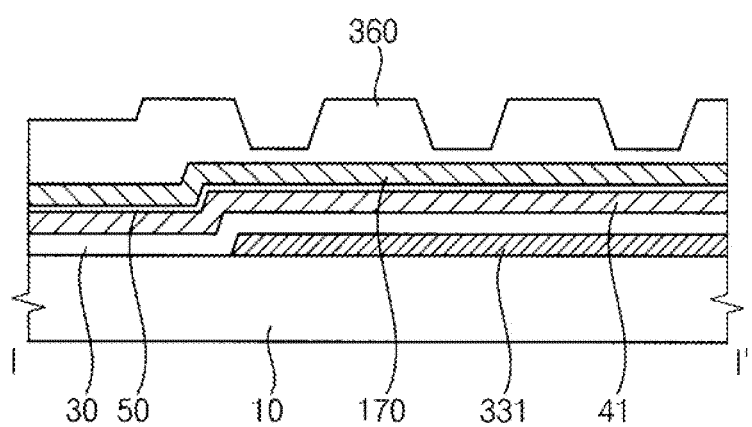
Figure 8E:
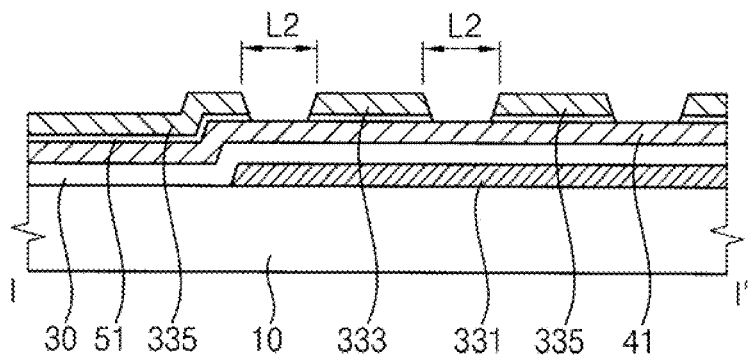

The remaining photoresist pattern 370 is removed through an ashing process using oxide plasma, etc., so that the thickness of the photoresist pattern 360 is decreased and the remaining photoresist pattern 370 is removed as illustrated in FIG. 8D. The photoresist pattern 360 is removed by a thickness of the remaining photoresist pattern 370. A data pattern, which exposes a channel area, is etched through a third etching process using the ashed photoresist pattern 360 and the ohmic contact layer 51 of the channel area is etched through a fourth etching process, so that the source electrode 335 and the drain electrode 333 of the tenth transistor T10 are spaced apart from each other, and the semiconductor layer 41 is exposed.

A channel length L2 of the tenth transistor T10 is defined as an interval between the source electrode 335 and the drain electrode 333. An interval between the source electrode 335 and the drain electrode 333 is about 1.5 times wider than the channel length L1 of the first transistor T1, so that the channel length L2 of the tenth transistor T10 is expanded compared to that of other transistors.

Figure 9:
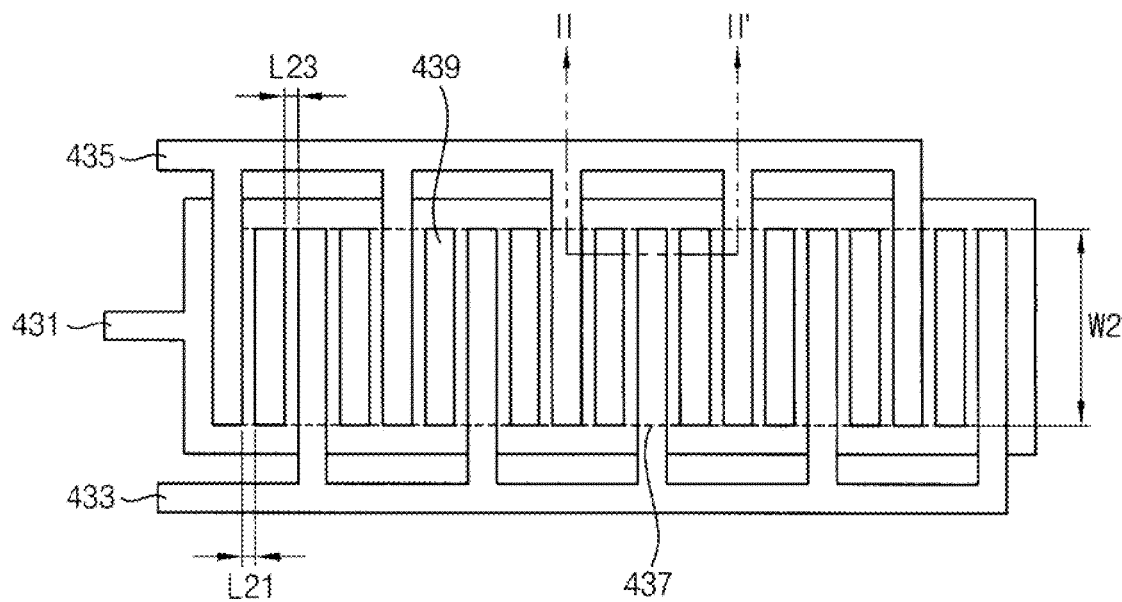
FIG. 9 is a plan view illustrating a tenth transistor according to an exemplary embodiment of the present invention.

FIG. 9 is a plan view illustrating a tenth transistor T10 according to an exemplary embodiment of the present invention.

Referring to FIG. 9, the tenth transistor T10 of the first holding part 242 of FIG. 3 according to an exemplary embodiment of the present invention has a channel length L2, which is about double a channel length L1 of the first transistor T1 of FIG. 6. The channel length L2 of the tenth transistor T10 is exemplary, and the channel length L2 of the tenth transistor T10 may be varied in accordance with a design of the gate drive circuit.

The tenth transistor T10 according to an exemplary embodiment includes a gate electrode 431, a source electrode 433 having a plurality of source electrode bars, a drain electrode 435 having a plurality of drain electrode bars, a channel 437 defined by the source electrode 433 and the drain electrode 435 on the gate electrode 431, and a plurality of floating electrodes 439 formed on the channel 437.

The floating electrodes 439 may perform a role of expanding a channel length L. The channel length L2 is an addition of a first channel length L21 and a second channel length L23. According to an exemplary embodiment, the channel length L2 is about 8 μm and the channel width W2 is about 32 μm. Thus, the tenth transistor T10 has a channel length L2 that is increased by about twice a channel length L1 of the first transistor T1. Moreover, the channel width W2 of the tenth transistor T10 is increased in proportion to the increased channel length of the tenth transistor T10, so that the tenth transistor T10 may have a channel length L2 and a channel width W2 that are large.

When five masks are used in a manufacturing process of the gate drive circuit, in order to expand a channel length L2 of the tenth transistor T10, a slit width of a mask area corresponding to the tenth transistor T10 may be expanded by the increased channel length L in comparison with other transistors except the tenth transistor T10.

When four masks are used in a manufacturing process of the gate drive circuit, a design of a mask pattern is needed to expand a channel length L2 of the tenth transistor T10. However, a conventional mask pattern may be used in a structure in which a floating electrode is inserted to a channel 437 of the tenth transistor T10 of FIG. 9.

Figure 10:
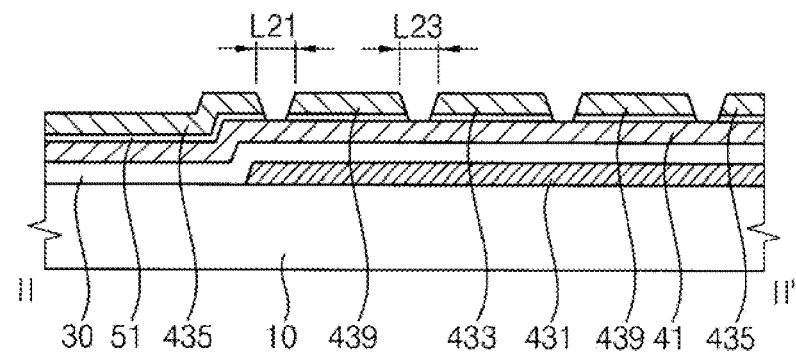
FIG. 10 is a cross-sectional view taken along a line II-II' in the tenth transistor of FIG. 9.

FIG. 10 is a cross-sectional view taken along a line II-II' in the tenth transistor T10 of FIG. 9.

Referring to FIG. 10, a gate insulation layer 30 is formed on a substrate 10 on which the gate electrode is formed, and a data pattern is formed on the gate insulation layer 30. The data pattern includes an active layer 40 for forming a channel of a transistor, a source electrode 435 having a plurality of source electrode bars, a drain electrode 433 having a plurality of drain electrode bars, and a floating electrode 439. Here, an ohmic contact layer 51 may be formed between the active layer 40 and a data pattern.

The channel length L2 of the tenth transistor T10 is defined as an interval between a source electrode 435 and a drain electrode 433. Since the tenth transistor T10 includes a floating electrode 439, the channel length L2 of the tenth transistor T10 is an addition of an interval L21 between a source electrode 435 and a floating electrode 439 and an interval between the floating electrode 439 and a drain electrode 433.

In order to form the floating electrode 439 for expanding the channel length L, a light-blocking area S10 is repeatedly formed at a mask for forming the tenth transistor T10. The mask pattern corresponding to the tenth transistor T10 may be formed by repeating the light-blocking area S10 for forming the floating electrode 439 with a boundary.

Figure 11A:
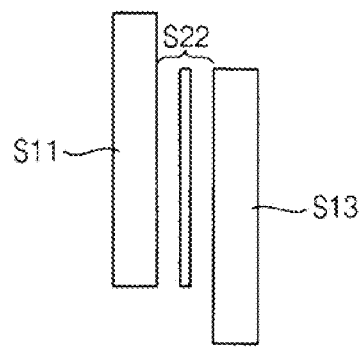
FIGS. 11 and 12 are plan views illustrating embodiments of mask pattern for enlarging a channel length of the tenth transistor of FIG. 10.
Figure 11B:
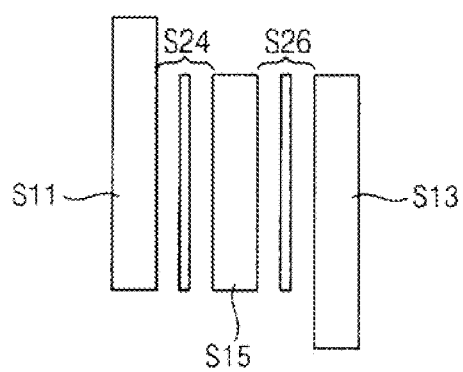
Figure 11C:
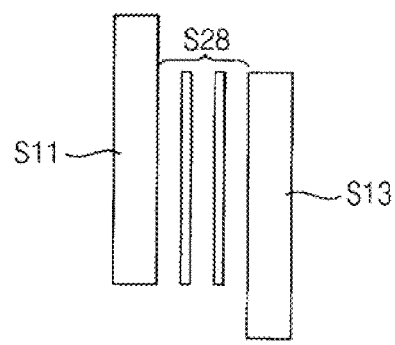

FIGS. 11 and 12 are plan views illustrating exemplary embodiments of mask pattern 300 for enlarging a channel length L2 of the tenth transistor T10 of FIG. 10. FIG. 11A is a plan view illustrating a mask pattern corresponding to the first transistor T1, and FIGS. 11B and 11C are plan views illustrating examples of the mask pattern corresponding to the tenth transistor T10.

Referring to FIGS. 11A and 11B, a mask pattern, which is used in a manufacturing process of a gate drive circuit, as illustrated in FIG. 11A may be used in a formation of a transistor in which a channel length is expanded by about 2 times as shown in FIG. 11B.

The mask pattern illustrated in FIG. 11A may be used in a formation of a first transistor T1 of FIG. 6. The mask pattern may include a first light-blocking area S11, a slit area S22 and a second light-blocking area S13.

The first light-blocking area S11 corresponds to a drain electrode 315 of the first transistor T1 as shown in FIG. 6, and the second light-blocking area S13 corresponds to a source electrode 313 of the first transistor T1. The slit area S22 corresponds to a channel 317 between the source electrode 313 and the drain electrode 315 of the first transistor T1 as shown in FIG. 6. For example, a channel length L of a transistor formed by the mask pattern as shown in FIG. 11A pattern may be about 5 μm.

The mask pattern illustrated in FIG. 11B can be used for expanding the channel length L of the first transistor T1 of FIG. 11A by about 2 times. The mask pattern illustrated in FIG. 11B may be designed by using the pattern of FIG. 11A. The mask pattern illustrated in FIG. 11B includes a first light-blocking area S11, a second light-blocking area S13, a third light-blocking area S15, a first slit area S24 and a second sit area S26. A single slit may be formed in the first and second slit areas S24 and S26, and plural slits may be formed in the first and second slit areas S24 and S26.

The first light-blocking area S11 corresponds to a drain electrode 435 of the tenth transistor T10 as shown in FIG. 9, and the second light-blocking area S13 corresponds to a source electrode 433 of the tenth transistor T10 as shown in FIG. 7. The third light-blocking area S15 corresponds to a floating electrode 439 of the tenth transistor T10 as shown in FIG. 9.

The first slit area S24 corresponds to a channel 437 between the drain electrode 435 and the floating electrode 439 of the tenth transistor T10 as shown in FIG. 9, and the second slit area S26 corresponds to a channel 437 between the floating electrode 439 and the source electrode 433 of the tenth transistor T10 as shown in FIG. 9. The first slit area S24 and the second slit area S26 may be the same as a size of the slit area S22 of FIG. 11A. For example, a channel of a transistor formed by the mask pattern of FIG. 9B is the result of an addition of about 5 μm formed by the first slit area S24 and about 5 μm formed by a second slit area S26. That is, the channel of the transistor formed by the mask pattern of FIG. 9B may have a channel length L of a total 10 μm.

Referring to FIG. 11C, a mask pattern includes a first light-blocking area S11, a second light-blocking area S13 and a slit area S28. The slit area S28 is an area for expanding a channel length L1 of the first transistor T1 to about 2 times. The slit area S28 may be designed by expanding the slit area S22 of FIG. 11A.

Figure 12A:
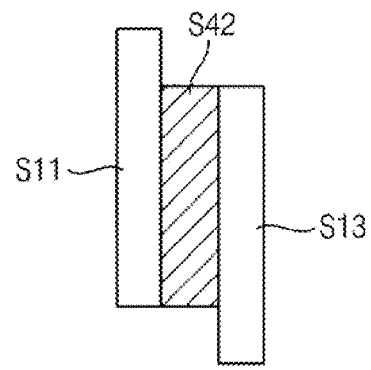
Figure 12B:
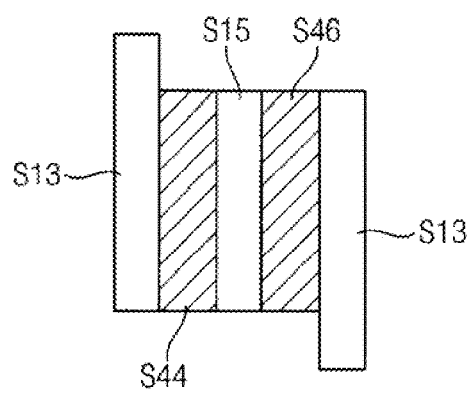
Figure 12C:
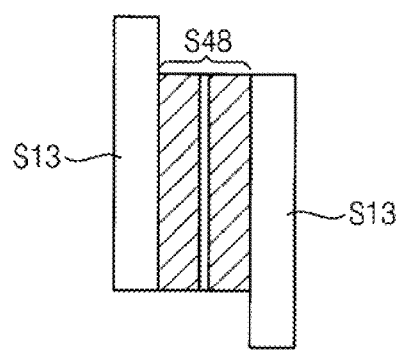

FIG. 12A is a plan view illustrating a halftone mask corresponding to the first transistor T1, and FIGS. 12B and 12C are plan views illustrating examples of the halftone mask corresponding to the tenth transistor T10.

Referring to FIGS. 12A and 12B, a halftone mask pattern, which is used in a manufacturing process of a gate drive circuit, as illustrated in FIG. 12A may be used in a formation of a transistor in which a channel length is expanded by about 2 times as shown in FIG. 12B.

The halftone mask pattern illustrated in FIG. 12A may be used in a formation of a first transistor T1 of FIG. 6. The halftone mask pattern may include a first light-blocking area S11, a half transmitting area S42 and a second light-blocking area S13.

The first light-blocking area S11 corresponds to a drain electrode 315 of the first transistor T1 as shown in FIG. 6, and the second light-blocking area S13 corresponds to a source electrode 313 of the first transistor T1. The half transmitting area S42 corresponds to a channel 317 between the source electrode 313 and the drain electrode 315 of the first transistor T1 as shown in FIG. 6. For example, a channel length L of a transistor formed by the mask pattern as shown in FIG. 12A pattern may be about 5 μm.

The mask pattern illustrated in FIG. 12B can be used for expanding the channel length L of the first transistor T1 of FIG. 12A by about 2 times. The mask pattern illustrated in FIG. 12B may be designed by using the pattern of FIG. 12A. The mask pattern illustrated in FIG. 12B includes a first light-blocking area S11, a first half transmitting area S44, a third light-blocking area S15, a second half transmitting area S47 and a second light-blocking area S13

The first light-blocking area S11 corresponds to a drain electrode 435 of the tenth transistor T10 as shown in FIG. 9, and the second light-blocking area S13 corresponds to a source electrode 433 of the tenth transistor T10 as shown in FIG. 7. The third light-blocking area S15 corresponds to a floating electrode 439 of the tenth transistor T10 as shown in FIG. 9.

The first half transmitting area S44 corresponds to a channel 437 between the drain electrode 435 and the floating electrode 439 of the tenth transistor T10 as shown in FIG. 9, and the second half transmitting area S46 corresponds to a channel 437 between the floating electrode 439 and the source electrode 433 of the tenth transistor T10 as shown in FIG. 9. The first half transmitting area S44 and the second half transmitting area S46 may be the same size as the half transmitting area S42 of FIG. 11A. For example, a channel of a transistor formed by the mask pattern of FIG. 12B is the result of an addition of about 5 μm formed by the first half transmitting area S44 and about 5 μm formed by a second half transmitting area S46. That is, the channel of the transistor formed by the mask pattern of FIG. 12B may have a channel length L of a total 10 μm.

Referring to FIG. 11C, a mask pattern includes a first light-blocking area S11, a half transmitting area S48 and a second light-blocking area S13. The half transmitting area S48 is an area for expanding a channel length L1 of the first transistor T1 by about 2 times. The half transmitting area S48 may be designed by expanding the half transmitting area S42 of FIG. 12A.

Generally, transistors used in a gate drive circuit may have the same channel length L except a transistor requiring a small current in a pull-up interval period of a gate signal. In the transistor having a different channel length L, a channel length L may be expanded to realize no less than a 1:1 ratio of channel width to channel length (W/L).

According to an embodiment of the present invention, a channel length L of the tenth transistor T10 is expanded compared to a channel length of other transistors within the gate drive circuit so as to stably maintain a high level state of the first node N1. A ratio of channel width to channel length (W/L) of the tenth transistor T10 is no less than 10:1 to have a great value that is greater than the other transistors.

A channel width 'W' of the tenth transistor T10 is expanded with the same multiple of the expanded channel length 'L'. That is, the channel width 'W' is expanded in proportion to the expanded channel length 'L' of the tenth transistor T10, so that a ratio of channel width to channel length (W/L) of the tenth transistor T10 may be maintained. Thus, a drain current of the tenth transistor T10 is maintained at an off voltage of the first node N1, so that a ripple voltage may be restrained at the first node N1.

FIG. 13 is a waveform diagram of a drain current in accordance with a variation of a channel length of the tenth transistor T10 when a source voltage is a high level.

Figure 13A:
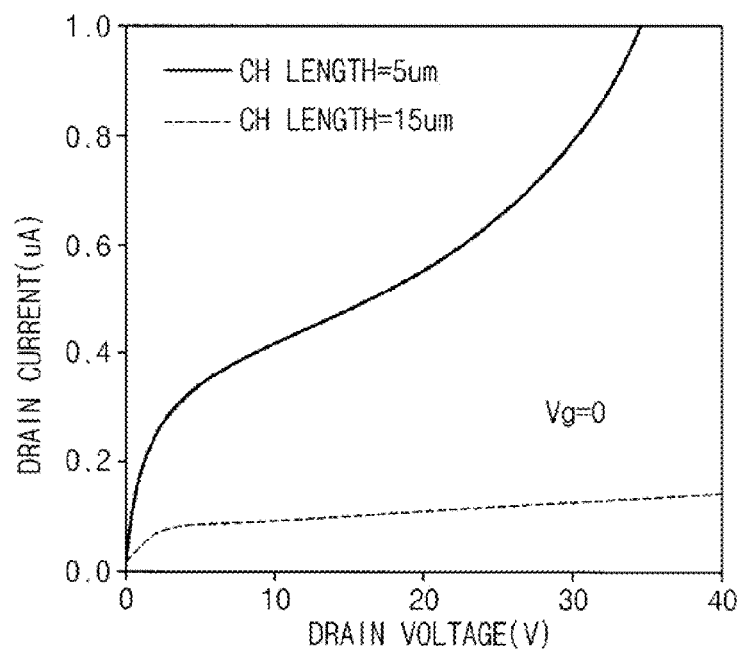
FIG. 13 is a waveform diagram of a drain current in accordance with a variation of a channel length of the tenth transistor when a source voltage is a high level.

Referring to FIG. 13A, when a gate voltage of the tenth transistor T10 of FIG. 3 is about 0 V and a channel length 'L' of the tenth transistor T10 is about 5 μm, a current which may hinder a pull-up operation of the first node N1 is increased in accordance with an increase of the drain voltage of the tenth transistor T10. However, when a gate voltage of the tenth transistor T10 is about 0 V and a channel length 'L' of the tenth transistor is expanded to about 3 times (about 15 μm), it is recognized that a current which may hinder a pull-up operation of the first node N1 is stable in accordance with an increase of the drain voltage of the tenth transistor T10.

Figure 13B:
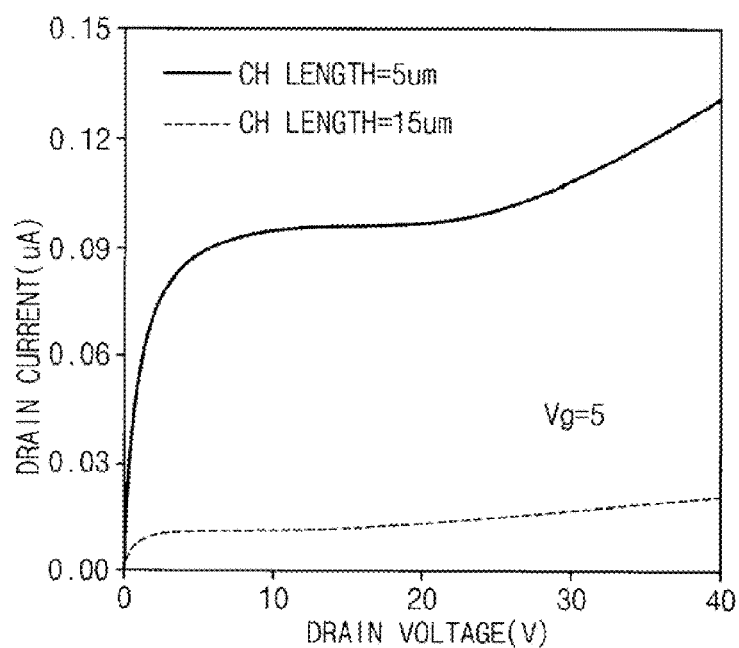

Referring to FIG. 13B, when a gate voltage of the tenth transistor T10 of FIG. 3 is about 5 V and a channel length 'L' of the tenth transistor T10 is about 5 μm, a current which may hinder a pull-up operation of the first node N1 is increased in accordance with an increase of the drain voltage of the tenth transistor T10. However, when a gate voltage of the tenth transistor T10 is about 5 V and a channel length 'L' of the tenth transistor is expanded to about 3 times (about 15 μm), it is recognized that a current which may hinder a pull-up operation of the first node N1 is stable in accordance with an increase of the drain voltage of the tenth transistor T10.

Therefore, a channel length 'L' of the tenth transistor T10 is increased to maintain a voltage of the first node N1 to a high level in a gate interval period, so that an output of a gate signal may be stable.

FIG. 14 is a waveform diagram showing a drain current in accordance with a variation of a channel length 'L' of the tenth transistor T10 when a voltage of the first node N1 as shown in FIG. 3 is an off voltage level.

Figure 14A:
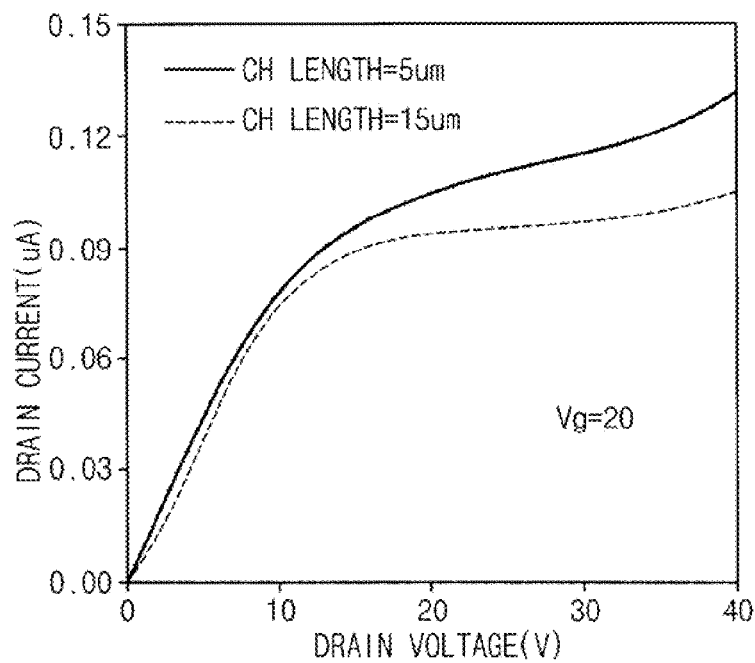
FIG. 14 is a waveform diagram showing a drain current in accordance with a variation of a channel length of the tenth transistor when a voltage of the first node as shown in FIG. 3 is an off voltage level.

Referring to FIG. 14A, when a gate voltage of the tenth transistor T10 as shown in FIG. 3 is about 20 V and a channel length L of the tenth transistor T10 is about 5 μm, a drain current which maintains a voltage of the first node N1 to an off voltage may be increased in accordance with an increase of a drain voltage. Similarly, when a gate voltage of the tenth transistor T10 is about 20 V and a channel length L of the tenth transistor T10 is expanded by about 3 times (i.e., about 15 μm), the drain current which maintains a voltage of the first node N1 to an of voltage may be increased in accordance with an increase of the drain voltage.

Figure 14B:
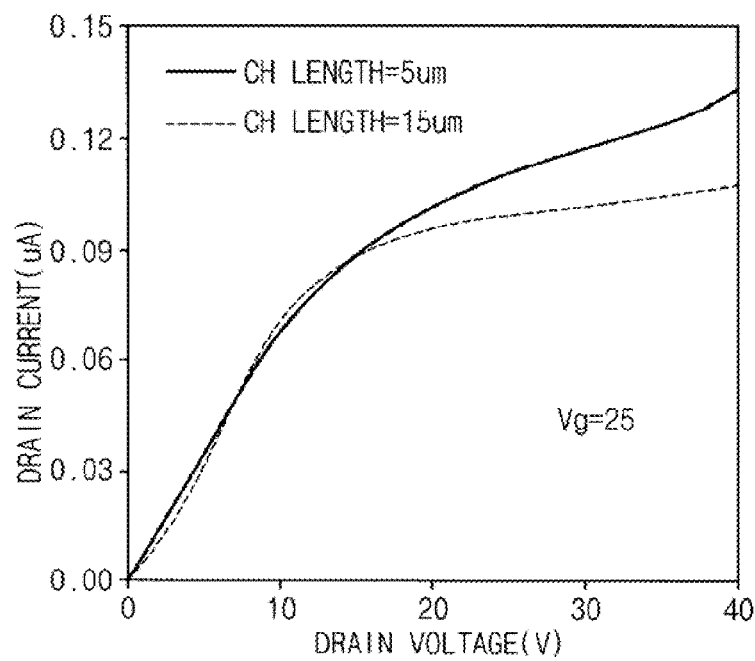

Referring to FIG. 14B, when a gate voltage of the tenth transistor T10 as shown in FIG. 3 is about 25 V and a channel length L of the tenth transistor T10 is about 5 μm, a drain current which maintains a voltage of the first node N1 to an off voltage may be increased in accordance with an increase of a drain voltage. Similarly, when a gate voltage of the tenth transistor T10 is about 25 V and a channel length L of the tenth transistor T10 is expanded by about 3 times (i.e., about 15 µm), the drain current which maintains a voltage of the first node N1 to an of voltage may be increased in accordance with an increase of the drain voltage.

However, as a drain voltage of the tenth transistor T10 is a low voltage that is no more than 1 V at a status in which a voltage of the first node N1 is an off voltage level, it is recognized that a difference between drain voltages may be small, which maintains a voltage of the first nose N1 to an off voltage at an interval period in which the drain voltage is no more than about 1 V.

Therefore, a channel length 'L' of the tenth transistor T10 is expanded as compared to a conventional channel length, so that an output of the gate signal may be stable during a pull-up interval period of the gate signal. Moreover, the channel width 'W' of the tenth transistor T10 is expanded by 2 times the channel length 'L,' so that a ripple of the first node N1 is decreased during a pull-down interval period of the gate signal so that an off voltage may be maintained.

As described above, according to an embodiment of the present invention, a channel length L of the tenth transistor is increased, so that a voltage of the first node connected to a gate electrode of the first transistor may be stably maintained in a high level.

Moreover, a channel width 'W' of the tenth transistor is increased by a multiple of the channel length 'L,' so that a ratio of channel width 'W' to channel length 'L' (W/L) of the tenth transistor is uniformly maintained. Therefore, a ripple voltage of a voltage of the first node connected to a gate electrode of the first transistor is decreased during a pull-down interval period of the gate signal, so that a reliability of the gate drive circuit may be secured.

The foregoing is illustrative of the present invention and is not to be construed as limiting thereof. Although exemplary embodiments of the present invention have been described, those skilled in the art will readily appreciate that many modifications are possible without materially departing from the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to exemplary embodiments disclosed, and that modifications to exemplary embodiments, as well as other embodiments, are intended to be included within the scope of the appended claims. The present invention is defined by the following claims, with equivalents of the claims to be included therein.

What is claimed is:

1. A gate drive circuit comprising a shift register in which plural stages are connected to each other in series, an (m)-th stage ('m' is a natural number) comprising:
an output part receiving a first clock signal and outputting the first clock signal as a gate signal in response to a control signal and discharging the gate signal in response to a second input signal, the output part comprising a first transistor having a first channel length;
a discharging part discharging the control signal to a second voltage level in response to the second input signal;
a first holding part maintaining the control signal on a first node at the second voltage level in response to the first clock signal, the first holding part comprising a second transistor having a second channel length that is longer than the first channel length;
a second holding part maintaining the control signal on the first node at the second voltage level in response to a second clock signal; and
a reset part providing the second voltage to the first node of the output part in response to a reset signal,
wherein the second transistor includes a source electrode connected to a gate electrode of the first transistor, and
wherein the reset part is directly connected to the first node.

2. The gate drive circuit of claim 1, wherein the second channel length is about 1.5 times to about 10 times longer than the first channel length.

3. The gate drive circuit of claim 2, wherein the second transistor has a channel width that is wider than a channel width of the first transistor by a first multiple substantially equal to a second multiple of the second channel length as compared to the first channel length.

4. The gate drive circuit of claim 3, wherein the first multiple is substantially equal to or greater than about ten times.

5. The gate drive circuit of claim 1, wherein the source electrode of the second transistor has a plurality of source electrode bars, and the second transistor further comprises a drain electrode having a plurality of drain electrode bars that are spaced apart from each of the source electrode bars to be disposed between the source electrode bars.

6. The gate drive circuit of claim 5, wherein the second transistor comprises a floating electrode disposed between each of the source electrode bars and each of the drain electrode bars, respectively.

7. The gate drive circuit of claim 1, wherein the second transistor further comprises a gate electrode receiving the first clock signal and a drain electrode connected to an output terminal in which the gate signal is outputted.

8. The gate drive circuit of claim 1, wherein the first holding part receives the first input signal as a vertical start signal or a gate signal of a previous stage in the series, and wherein the second input signal is a gate signal of a next stage in the series, or a vertical start signal.

9. The gate drive circuit of claim 1, wherein the output part comprises:
a pull-up part receiving the first clock signal and outputting the first clock signal as the gate signal in response to the control signal on the first node of the output part, wherein the control signal is converted into a first voltage level by the first input signal; and
a pull-down part discharging the gate signal to the second voltage level in response to the second input signal, and the first transistor is disposed on the output part.

10. The gate drive circuit of claim 9, wherein the first clock signal has a phase different from that of the second clock signal, the first voltage level is a high voltage level, and the second voltage is an off voltage level.

11. The gate drive circuit of claim 9, further comprising:
a buffering part comprising a third transistor connected to the first node, the buffering part charging the first voltage level of the first input signal to the first node; and
a carry part outputting the first clock signal as a carry signal in response to a signal of the first node.

12. The gate drive circuit of claim 11, wherein the first input signal is a vertical start signal or a carry signal of one of previous stages in the series, and the second input signal is a gate signal of the one of next stages in the series, or a vertical start signal.

13. The gate drive circuit of claim 1, further comprising:
a third holding part maintaining the gate signal at the second voltage level in response to the second clock signal;

a fourth holding part alternately maintaining the gate signal at the second voltage level with the third holding part; and a switching part switching the fourth holding part on/off.

14. A display device comprising:

a display panel comprising a display area on which a plurality of pixel parts is formed and a peripheral area surrounding the display area, each of the pixel parts electrically connected to a gate line and a data line crossing the gate line;

a data driving section outputting a data signal to the data lines; and a gate drive circuit comprising a shift register in which plural stages are connected to each other in series, an (m)-th stage ('m' is a natural number) comprising:

an output part receiving a first clock signal and outputting the first clock signal as a gate signal in response to a control signal and discharging the gate signal in response to a second input signal, the output part comprising a first transistor having a first channel length;

a discharging part discharging the control signal to a second voltage level in response to the second input signal;

a first holding part maintaining the control signal at the second voltage level on a first node in response to the first clock signal, the first holding part comprising a second transistor having a second channel length that is longer than the first channel length;

a second holding part maintaining the control signal at the second voltage level in response to a second clock signal; and a reset part providing the second voltage level to the first node of the output part in response to a reset signal, wherein the second transistor includes a source electrode connected to a gate electrode of the first transistor, and wherein the reset part is directly connected to the first node.

\* \* \* \* \*